(12) United States Patent
Cai et al.

(10) Patent No.: US 9,590,561 B2
(45) Date of Patent: Mar. 7, 2017

(54) POWER AMPLIFIER

(71) Applicant: Marvell World Trade Ltd., St. Michael (BB)

(72) Inventors: Li Cai, Singapore (SG); Juan Xie, Singapore (SG); Poh Boon Leong, Cupertino, CA (US)

(73) Assignee: MARVELL WORLD TRADE LTD., St. Michael (BB)

( * ) Notice: Subject to any disclaimer, the term of this patent is extended or adjusted under 35 U.S.C. 154(b) by 36 days.

(21) Appl. No.: 14/676,748

(22) Filed: Apr. 1, 2015

(65) Prior Publication Data

US 2015/0288334 A1 Oct. 8, 2015

Related U.S. Application Data

(60) Provisional application No. 61/974,941, filed on Apr. 3, 2014.

(51) Int. Cl.
*H03F 3/45* (2006.01)
*H03F 1/02* (2006.01)
(Continued)

(52) U.S. Cl.
CPC ........... *H03F 1/0205* (2013.01); *H03F 1/565* (2013.01); *H03F 3/193* (2013.01); *H03F 3/21* (2013.01);
(Continued)

(58) Field of Classification Search
USPC ........................................ 330/253, 302, 306
(Continued)

(56) References Cited

U.S. PATENT DOCUMENTS 6,426,680 B1 * 7/2002 Duncan ............... H01F 17/0006
257/E27.046
7,756,486 B1 * 7/2010 Tan ........................ H04B 1/525
323/222
(Continued)

FOREIGN PATENT DOCUMENTS

| JP | 2005-057744 A | 3/2005 |
| JP | 2011-250084 A | 12/2011 |
| KR | 10-2008-0098268 A | 11/2008 |

OTHER PUBLICATIONS

International Search Report and Written Opinion for PCT/US2015/023947, filed Apr. 1, 2015.

*Primary Examiner* — Patricia T Nguyen

(57) ABSTRACT

An apparatus includes a differential amplifier. The differential amplifier includes a first side circuit configured to receive a first input signal, a second side circuit configured to receive a second input signal, and a resonant tank circuit coupled between the first and second side circuits. A first capacitor and first switch may be provided in series between a source and drain of a cascode transistor. A second capacitor and second switch may be provided in series between a source and drain of an input transistor. A method includes receiving a first input signal by a first side circuit, receiving a second input signal by a second side circuit, controlling a resource of a resonant tank circuit, and outputting an output signal according to the first and second input signals. The resource of the resonant tank circuit may be controlled according to a transmission mode, frequency band, or both.

19 Claims, 3 Drawing Sheets

(51) Int. Cl.
*H03F 3/193* (2006.01)
*H03F 3/21* (2006.01)
*H03F 1/56* (2006.01)
*H03F 3/24* (2006.01)

(52) U.S. Cl.
CPC ......... *H03F 3/245* (2013.01); *H03F 3/45179* (2013.01); *H03F 3/45201* (2013.01); *H03F 3/45228* (2013.01); *H03F 3/45475* (2013.01); *H03F 2200/168* (2013.01); *H03F 2200/213* (2013.01); *H03F 2200/451* (2013.01); *H03F 2203/45162* (2013.01); *H03F 2203/45488* (2013.01); *H03F 2203/45621* (2013.01)

(58) Field of Classification Search
IPC ......................................................... H03F 3/45
See application file for complete search history.

(56) References Cited

U.S. PATENT DOCUMENTS

| | | | |
|---|---|---|---|
| 2006/0197597 A1 | 9/2006 | Ananth | |
| 2007/0176679 A1* | 8/2007 | Kluge | H03F 1/565 |
| | | | 330/253 |
| 2009/0189697 A1* | 7/2009 | Zafonte | H03F 1/56 |
| | | | 330/305 |
| 2012/0064836 A1* | 3/2012 | Bauwelinck | H03F 1/223 |
| | | | 455/73 |
| 2012/0235746 A1* | 9/2012 | Li | H03F 1/0261 |
| | | | 330/261 |
| 2012/0274403 A1 | 11/2012 | Kim et al. | |
| 2015/0372645 A1* | 12/2015 | Banerjee | H03F 3/193 |
| | | | 330/251 |

* cited by examiner

POWER AMPLIFIER

CROSS REFERENCE TO RELATED APPLICATION

This present disclosure claims the benefit of U.S. Provisional Application No. 61/974,941, filed on Apr. 3, 2014, which is incorporated by reference herein in its entirety.

BACKGROUND

Power amplifiers (PAs) amplify an input signal and provide an amplified output signal having a significant amount of power. Radio Frequency (RF) PAs may provide the amplified output signal to an antenna or to another power amplifier having a higher output power.

An RF PA may be required to operate with a high linearity, such as when regulations limit the transmitted power and distortion produced by the RF PA. The RF PA may also be required to operate with high efficiency, in order to minimize the amount of waste heat generated by the RF PA, prolong the duration of an operation of a battery powered device, or both.

When the output of the RF PA is provided to an antenna, the impedance of the antenna may vary substantially because of environmental conditions. For example, the impedance of a cellular telephone antenna may vary substantially depending on whether and how the cellular telephone is being held. The variations in the impedance of the antenna may cause a higher voltage to be present across components of the RF PA, which may damage the RF PA.

The RF PA may be used to transmit in a number of different frequency bands, and in a number of different modes. The power and linearity requirements of each frequency band and each mode may be different from the power and linearity requirements of other frequency bands and other modes.

SUMMARY

In an embodiment, an apparatus includes a differential amplifier. The differential amplifier includes a first side circuit configured to receive a first input signal, a second side circuit configured to receive a second input signal, and a resonant tank circuit coupled between the first and second side circuits.

In an embodiment, the first side circuit includes a first cascode transistor, the second side circuit includes a second cascode transistor, the first and second input signals are a differential signal pair, and the resonant tank circuit is coupled between a source of the first cascode transistor and a source of the second cascode transistor.

In an embodiment, a first capacitor and a first switch are provided in series between the source of the first cascode transistor and a drain of the first cascode transistor.

In an embodiment, a controller circuit is configured to control the first switch according to a transmission mode, a determination regarding a source-drain voltage of the first cascode transistor, or both.

In an embodiment, the first side circuit includes a first input transistor. The first input transistor includes a gate configured to receive the first input signal and a drain connected to the source of the first cascode transistor. A second capacitor and a second switch are provided in series between a source and the drain of the first input transistor.

In an embodiment, the resonant tank circuit includes an inductor and a variable capacitor provided in parallel with the inductor.

In an embodiment, a controller circuit is configured to control a capacitance value of the variable capacitor according to a transmission mode, a frequency band, or both.

In an embodiment, the inductor and the variable capacitor are provided in a semiconductor die.

In an embodiment, the resonant tank circuit is a first resonant tank circuit, and the differential amplifier further includes a third side circuit configured to receive the first input signal, a fourth side circuit configured to receive the second input signal, and a second resonant tank circuit coupled between the third and fourth side circuits.

In an embodiment, the first side circuit includes a first n-channel Metal-Oxide-Semiconductor Field Effect (nMOSFET) cascode transistor, the second side circuit includes a second nMOSFET cascode transistor, the third side circuit includes a first p-channel Metal-Oxide-Semiconductor Field Effect (pMOSFET) cascode transistor, and the fourth side circuit includes a second pMOSFET cascode transistor. The first resonant tank circuit is coupled between a source of the first nMOSFET cascode transistor and a source of the second nMOSFET cascode transistor, and the second resonant tank circuit is coupled between a source of the first pMOSFET cascode transistor and a source of the second pMOSFET cascode transistor.

In an embodiment, a first capacitor is coupled between a drain of the first nMOSFET cascode transistor and a drain of the first pMOSFET cascode transistor, and a second capacitor is coupled between a drain of the second nMOSFET cascode transistor and a drain of the second pMOSFET cascode transistor.

In an embodiment, an amplifier includes a transistor, a capacitor, and a switch. The switch and the capacitor are provided in series between first and second conduction terminals of the transistor.

In an embodiment, the transistor is a cascode transistor.

In an embodiment, the amplifier is configured to receive an input signal, and a control terminal of the transistor receives the input signal.

In an embodiment, the transistor is a Metal-Oxide-Semiconductor Field Effect Transistor (MOSFET).

In an embodiment, a method includes receiving a first input signal by a first side circuit, receiving a second input signal by a second side circuit, controlling a resource of a resonant tank circuit, and outputting an output signal according to the first and second input signals.

In an embodiment, the resonant tank circuit is coupled between the first and second side circuits.

In an embodiment, the first side circuit includes a transistor, a switch, and a capacitor coupled to the switch in series. The method further includes detecting a condition associated with an occurrence of a high source-drain voltage of the transistor, and turning on the switch when the condition is detected.

In an embodiment, the method further includes receiving the first input signal by a third side circuit, receiving the second input signal by a fourth side circuit, and combining outputs of the first, second, third and fourth side circuits.

In an embodiment, the method further includes controlling the resource of the resonant tank circuit according to a transmission mode, a frequency band, or both.

DETAILED DESCRIPTION

Figure 1:
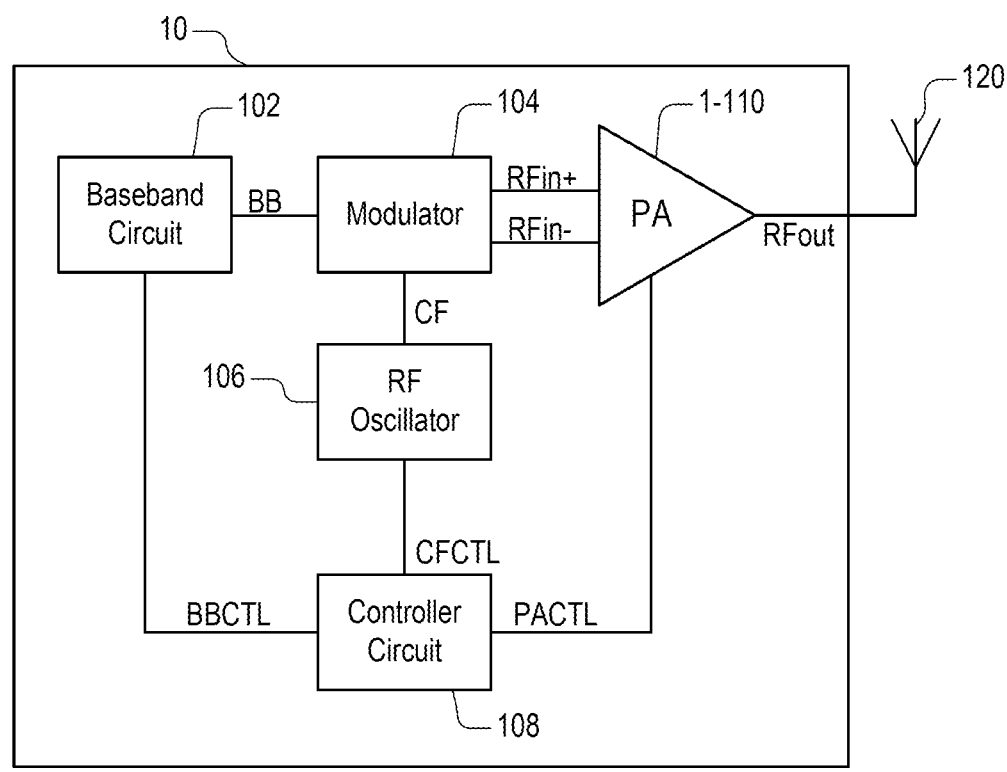
FIG. 1 illustrates an electronic system including a Power Amplifier (PA) according to embodiment.

FIG. 1 illustrates an electronic device 10 including a power amplifier (PA) 1-110 according to an embodiment. The electronic device 10 also includes a baseband circuit 102, a modulator circuit 104, a Radio Frequency (RF) oscillator 106, and a controller circuit 108. The electronic device 10 is connected to an antenna 120.

In an embodiment, the electronic device 10 is a cellular phone, tablet computer, laptop computer, modem, hotspot, or other such device capable of transmitting a radio frequency signal. In an embodiment, the electronic device 10 is provided using an integrated circuit.

The baseband circuit 102 is configured to generate a baseband signal BB according to a baseband control signal BBCTL received from the controller circuit 108. The baseband control signal BBCTL may control one or more of an encoding scheme, a modulation rate, a bandwidth, and other baseband signal BB properties associated with transmission modes of the electronic device 10. In an embodiment, the transmission modes may include one or more of a Global System for Mobile communications (GSM) mode, an Enhanced Data rates for GSM Evolution (EDGE) mode, a Time Division Synchronous Code Division Multiple Access (TD-SCDMA) mode, and the like.

The RF oscillator 106 is configured to generate a carrier frequency signal CF according to a carrier frequency control signal CFCTL received from the controller circuit 108. In an embodiment, the carrier frequency control signal CFCTL may cause the RF oscillator 106 to generate a carrier frequency signal CF having a frequency in a 1.7 to 2.0 GHz band or a 700 MHz to 900 MHz band. The 1.7 to 2.0 GHz band may include a Digital Cellular Service (DCS) band, a Personal Communication Service (PCS) band, a 3rd Generation Partnership Project (3GPP) Time-Division Duplexing (TDD) band 34, and a 3GPP TDD band 39.

The modulator circuit 104 is configured to produce first and second RF signals RFin+ and RFin− by modulating the carrier frequency signal CF according to the baseband signal BB. The first and second RF signals RFin+ and RFin− are a differential signal pair, that is, a voltage value of the second RF signal RFin− is equal to a predetermined constant voltage value K minus a voltage value of the first RF signal RFin+ (i.e., RFin−=K−RFin+).

The controller circuit 108 produces the baseband control signal BBCTL, the carrier frequency control signal CFCTL, and the PA control signal PACTL. In an embodiment, the controller circuit 108 includes a non-transitory computer-readable media and a processor, and operations of the controller circuit 108 are performed by the processor executing computer programming instructions stored on the non-transitory computer-readable media.

The PA 1-110 is configured to produce an RF output signal RFout by amplifying a difference between the first and second RF signals RFin+ and RFin− according to a PA control signal PACTL received from the controller circuit 108. The PA control signal PACTL controls the internal configuration of the PA 1-110 according to an transmission mode of the electronic device 10 and a frequency band of the carrier frequency signal CF.

The RF output signal RFout is provided to the antenna 120. A person of ordinary skill in the art in light of the teachings and disclosures herein would understand how to implement the baseband circuit 102, the modulator circuit 104, the RF oscillator 106, the controller circuit 108, and the antenna 120.

Figure 2:
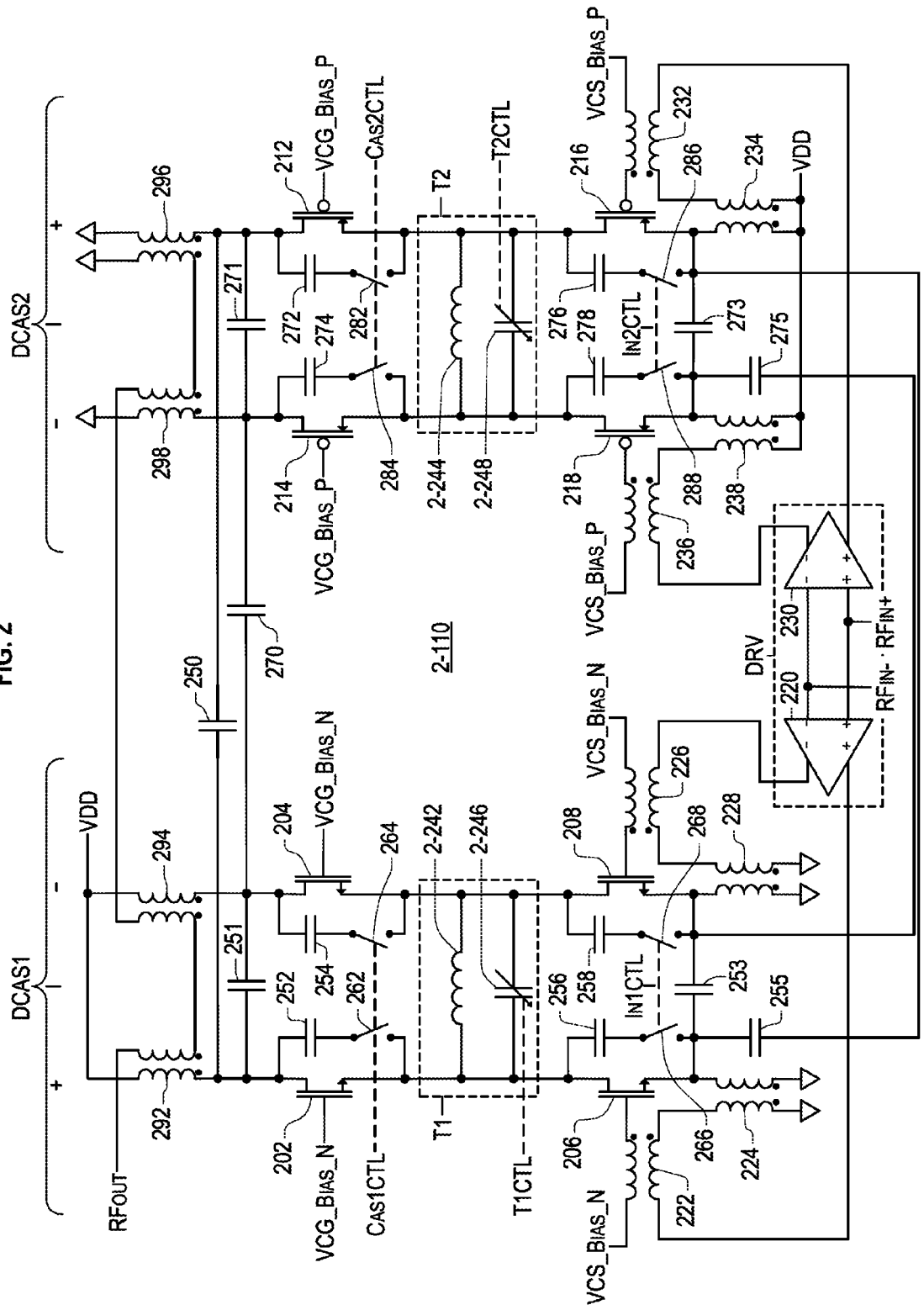
FIG. 2 is a schematic of a power amplifier according to an embodiment.

FIG. 2 is a schematic of a power amplifier (PA) 2-110 suitable for use as the PA 1-110 of FIG. 1, according to an embodiment. The PA 2-110 includes a driver stage DRV and first and second differential cascode amplifier stages DCAS1 and DCAS2.

The driver stage DRV includes first and second differential driver circuits 220 and 230. The first and second differential driver circuits 220 and 230 each receive and amplify the first and second RF signals RFin+ and RFin− to produce respective differential outputs. A person of skill in the art in light of the teachings and disclosures herein would understand how to implement the first and second differential driver circuits 220 and 230.

The first differential cascode amplifier stage DCAS1 includes a first (plus) side circuit, a second (minus) side circuit and a first resonant tank circuit T1 connected between the plus and minus side circuits of the first differential cascode amplifier stage DCAS1.

The plus side circuit of the first differential cascode amplifier stage DCAS1 is a cascode amplifier and includes a first cascode transistor 202, a first input transistor 206, first and second input transformers 222 and 224, first and third capacitors 252 and 256, first and third switches 262 and 266, and a first output transformer 292.

A first terminal of a first winding of the first output transformer 292 is connected to a supply voltage VDD. A second terminal of the first winding of the first output transformer 292 is connected to a first conduction terminal (e.g., a drain) of the first cascode transistor 202.

A control terminal (e.g., a gate) of the first cascode transistor 202 is connected to an re-channel cascode bias voltage signal VCG_Bias_N. A second conduction terminal (e.g., a source) of the first cascode transistor 202 is connected to a drain of the first input transistor 206. In an embodiment, the first cascode transistor 202 includes an n-channel Metal-Oxide-Semiconductor Field Effect Transistor (nMOSFET).

The first capacitor 252 and the first switch 262 are connected in series between the source and the drain of the first cascode transistor 202. The first switch 262 is controlled by a first cascode control signal Cas1CTL. In an embodiment, the first cascode control signal Cas1CTL is a signal in the PA control signal PACTL of FIG. 1.

A gate of the first input transistor 206 is connected to a first terminal of a first winding of the first input transformer 222. A source of the first input transistor 206 is connected to a first terminal of a first winding of the second input transformer 224. In an embodiment, the first input transistor 206 includes an nMOSFET.

The third capacitor 256 and the third switch 266 are connected in series between the source and the drain of the first input transistor 206. The third switch 266 is controlled by a first input control signal In1CTL. In an embodiment, the first input control signal In1CTL is a signal in the PA control signal PACTL of FIG. 1.

A second terminal of the first winding of the first input transformer 222 is connected to an n-channel input bias voltage signal VCS_Bias_N. A second terminal of the first winding of the second input transformer 224 is connected to a ground. In an embodiment, a voltage value of the n-channel input bias voltage signal VCS_Bias_N is selected so that the first differential cascode amplifier stage DCAS1 operates as a class AB amplifier.

A first terminal of a second winding of the first input transformer 222 is connected to a first terminal of a second winding of the second input transformer 224. A second terminal of the second winding of the first input transformer 222 is connected to a plus output of the first differential driver circuit 220. A second terminal of the second winding of the second input transformer 224 is connected to the ground.

The minus side circuit of the first differential cascode amplifier stage DCAS1 is a cascode amplifier and includes a second cascode transistor 204, a second input transistor 208, third and fourth input transformers 226 and 228, second and fourth capacitors 254 and 258, second and fourth switches 264 and 268, and a second output transformer 294.

A first terminal of a first winding of the second output transformer 294 is connected to the supply voltage VDD. A second terminal of the first winding of the second output transformer 294 is connected to a drain of the second cascode transistor 204. An eleventh capacitor 251 is connected between the drain of the second cascode transistor 204 and the drain of the first cascode transistor 202.

A gate of the second cascode transistor 204 is connected to the n-channel cascode bias voltage signal VCG_Bias_N. A source of the second cascode transistor 204 is connected to a drain of the second input transistor 208. In an embodiment, the second cascode transistor 204 includes an nMOSFET.

The second capacitor 254 and the second switch 264 are connected in series between the source and the drain of the second cascode transistor 204. The second switch 264 is controlled by the first cascode control signal Cas1CTL.

A gate of the second input transistor 208 is connected to a first terminal of a first winding of the third input transformer 226. A source of the second input transistor 208 is connected to a first terminal of a first winding of the fourth input transformer 228. A twelfth capacitor 253 is connected between the source of the second input transistor 208 and the source of the first input transistor 206. In an embodiment, the second input transistor 208 includes an nMOSFET.

The fourth capacitor 258 and the fourth switch 268 are connected in series between the source and the drain of the second input transistor 208. The fourth switch 268 is controlled by the first input control signal In1CTL.

A second terminal of the first winding of the third input transformer 226 is connected to the n-channel input bias voltage signal VCS_Bias_N. A second terminal of the first winding of the fourth input transformer 228 is connected to the ground.

A first terminal of a second winding of the third input transformer 226 is connected to a first terminal of a second winding of the fourth input transformer 228. A second terminal of the second winding of the third input transformer 226 is connected to a minus output of the first differential driver circuit 220. A second terminal of the second winding of the fourth input transformer 228 is connected to the ground.

The first cascode control signal Cas1CTL and the first input control signal In1CTL may be controlled to improve the linearity and reliability of the first differential cascode amplifier stage DCAS1.

When the first cascode control signal Cas1CTL has a first value, the first and second switches 262 and 264 are open.

When the first cascode control signal Cas1CTL has a second value, the first and second switches 262 and 264 are closed.

When the first and second switches 262 and 264 are closed, the first and second switches 262 and 264 and the first and second capacitors 252 and 254 operate to provide shunts across the sources and drains of the first and second cascode transistors 202 and 204, respectively. The shunts cause the drain-source voltages of the first and second cascode transistors 202 and 204 to be lower than when the first and second switches 262 and 264 are open.

The lowering of the drain-source voltages of the first and second cascode transistors 202 and 204 improves the linearity of the PA 2-110. Furthermore, the lowered drain-source voltages are less likely to damage the first and second cascode transistors 202 and 204.

In an embodiment, a circuit such as the controller circuit 108 of FIG. 1 detects a situation wherein a high source-drain voltage of the first and second cascode transistors 202 and 204 might occur and, when the situation is detected, closes the first and second switches 262 and 264 in order to reduce the source-drain voltage of the first and second cascode transistors 202 and 204. For example, the controller circuit 108 may detect a change in an impedance of the antenna 120, such as might occur when a user grabs a cellular phone, and may close the first and second switches 262 and 264 to protect the first and second cascode transistors 202 and 204 from a high Voltage Standing Wave Ratio (VSWR) that may result from the change in the impedance of the antenna 120.

In an embodiment, a circuit such as the controller circuit 108 of FIG. 1 may close the first and second switches 262 and 264 to improve the linearity of the PA 2-110 when the electronic device 10 is operating in a predetermined transmission mode, for example, an EDGE mode.

When the first input control signal In1CTL has a first value, the third and fourth switches 266 and 268 are open. When the first input control signal In1CTL has a second value, the third and fourth switches 266 and 268 are closed.

When the third and fourth switches 266 and 268 are closed, the third and fourth switches 266 and 268 and the third and fourth capacitors 256 and 258 operate to provide shunts across the sources and drains of the first and second input transistors 206 and 208, respectively. The shunts cause the drain-source voltages of the first and second input transistors 206 and 208 to be lower than when the third and fourth switches 266 and 268 are open.

The first input control signal In1CTL may be controlled as described for the first cascode control signal Cas1CLT.

The first resonant tank circuit T1 includes a first tank inductor 2-242 and a first tank variable capacitor 2-246. The first tank inductor 2-242 and the first tank variable capacitor 2-246 are resources of the first resonant tank circuit T1. The first tank inductor 2-242 is connected between the drain of the first input transistor 206 of the plus side circuit of the first differential cascode amplifier DCAS1 and the drain of the second input transistor 208 of the minus side circuit of the first differential cascode amplifier DCAS1.

The first tank variable capacitor 2-246 is connected between the drain of the first input transistor 206 and the drain of the second input transistor 208, in parallel with the first tank inductor 2-242. A capacitance value of the first tank variable capacitor 2-246 is controlled according to a first tank control signal T1CTL. In an embodiment, the first tank control signal T1CTL is a signal in the PA control signal PACTL of FIG. 1.

The first resonant tank circuit T1 is configured to compensate for parasitic capacitances of the first and second input transistors 206 and 208, that is, to minimize the detrimental effects of those parasitic capacitances, by resonating with the parasitic capacitances at a resonance frequency. The resonance frequency is determined by an inductance value of the first tank inductor 2-242, capacitance values of the parasitic capacitances, and a capacitance value of the first tank variable capacitor 2-246.

In the embodiment of FIG. 1, the controller circuit 108 controls the resonance frequency of the first resonant tank circuit T1 using the first tank control signal T1CTL. The controller circuit 108 may control the resonance frequency according to a transmission mode of the electronic device 10, a frequency of the carrier frequency signal CF, or both.

The second differential cascode amplifier stage DCAS2 is a includes a third (plus) side circuit, a fourth (minus) side circuit and a second resonant tank circuit T2 connected between the plus and minus side circuits of the second differential cascode amplifier stage DCAS2.

The plus side circuit of the second differential cascode amplifier stage DCAS2 includes a third cascode transistor 212, a third input transistor 216, fifth and sixth input transformers 232 and 234, fifth and seventh capacitors 272 and 276, fifth and seventh switches 282 and 286, and a third output transformer 296.

A first terminal of a first winding of the third output transformer 296 is connected to the ground. A second terminal of the first winding of the third output transformer 296 is connected to a drain of the third cascode transistor 212.

A gate of the third cascode transistor 212 is connected to a p-channel cascode bias voltage signal VCG_Bias_P. A source of the third cascode transistor 212 is connected to a drain of the third input transistor 216. In an embodiment, the third cascode transistor 212 includes a p-channel MOSFET (pMOSFET).

The fifth capacitor 272 and the fifth switch 282 are connected in series between the source and the drain of the third cascode transistor 212. The fifth switch 282 is controlled by a second cascode control signal Cas2CTL. In an embodiment, the second cascode control signal Cas2CTL is a signal in the PA control signal PACTL of FIG. 1.

A gate of the third input transistor 216 is connected to a first terminal of a first winding of the fifth input transformer 232. A source of the third input transistor 216 is connected to a first terminal of a first winding of the sixth input transformer 234. In an embodiment, the third input transistor 206 includes a pMOSFET.

The seventh capacitor 276 and the seventh switch 286 are connected in series between the source and the drain of the third input transistor 216. The seventh switch 286 is controlled by a second input control signal In2CTL. In an embodiment, the second input control signal In2CTL is a signal in the PA control signal PACTL of FIG. 1.

A second terminal of the first winding of the fifth input transformer 232 is connected to a p-channel input bias voltage signal VCS_Bias_P. A second terminal of the first winding of the sixth input transformer 234 is connected to the supply voltage VDD. In an embodiment, a voltage value of the p-channel input bias voltage signal VCS_Bias_P is selected so that the second differential cascode amplifier stage DCAS2 operates as a class A amplifier.

A first terminal of a second winding of the fifth input transformer 232 is connected to a first terminal of a second winding of the sixth input transformer 234. A second terminal of the second winding of the fifth input transformer 232 is connected to a plus output of the second differential driver circuit 230. A second terminal of the second winding of the sixth input transformer 234 is connected to the supply voltage VDD.

The minus side circuit of the second differential cascode amplifier stage DCAS2 includes a fourth cascode transistor 214, a fourth input transistor 218, seventh and eighth input transformers 236 and 238, sixth and eighth capacitors 274 and 278, sixth and eighth switches 284 and 288, and a fourth output transformer 298.

A first terminal of a first winding of the fourth output transformer 298 is connected to the ground. A second terminal of the first winding of the fourth output transformer 298 is connected to a drain of the fourth cascode transistor 214. A thirteenth capacitor 271 is connected between the drain of the fourth cascode transistor 214 and the drain of the third cascode transistor 212.

A gate of the fourth cascode transistor 214 is connected to the p-channel cascode bias voltage signal VCG_Bias_P. A source of the fourth cascode transistor 214 is connected to a drain of the fourth input transistor 218. In an embodiment, the fourth cascode transistor 214 includes a pMOSFET.

The sixth capacitor 274 and the sixth switch 284 are connected in series between the source and the drain of the fourth cascode transistor 214. The sixth switch 284 is controlled by the second cascode control signal Cas2CTL.

A gate of the fourth input transistor 218 is connected to a first terminal of a first winding of the seventh input transformer 236. A source of the fourth input transistor 218 is connected to a first terminal of a first winding of the eighth input transformer 238. A fourteenth capacitor 273 is connected between the source of the fourth input transistor 218 and the source of the third input transistor 216. In an embodiment, the fourth input transistor 218 includes a pMOSFET.

The eighth capacitor 278 and the eighth switch 288 are connected in series between the source and the drain of the fourth input transistor 218. The eighth switch 288 is controlled by the second input control signal In2CTL.

A second terminal of the first winding of the seventh input transformer 236 is connected to the p-channel input bias voltage signal VCS_Bias_P. A second terminal of the first winding of the eight input transformer 238 is connected to the supply voltage VDD.

A first terminal of a second winding of the seventh input transformer 236 is connected to a first terminal of a second winding of the eighth input transformer 238. A second terminal of the second winding of the seventh input transformer 236 is connected to a minus output of the second differential driver circuit 230. A second terminal of the second winding of the eighth input transformer 238 is connected to the supply voltage VDD.

The second cascode control signal Cas2CTL and the second input control signal In2CTL may be controlled to improve the linearity and reliability of the second differential cascode amplifier stage DCAS2.

When the second cascode control signal Cas2CTL has a first value, the fifth and sixth switches 282 and 284 are open. When the second cascode control signal Cas2CTL has a second value, the fifth and sixth switches 282 and 284 are closed.

When the fifth and sixth switches 282 and 284 are closed, the fifth and sixth switches 282 and 284 and the fifth and sixth capacitors 272 and 274 operate to provide shunts across the sources and drains of the third and fourth cascode transistors 212 and 214, respectively. The shunts cause the drain-source voltages of the third and fourth cascode transistors 212 and 214 to be lower than when the fifth and sixth switches 282 and 284 are open.

The lower drain-source voltages of the third and fourth cascode transistors 212 and 214 improve the linearity of the PA 2-110. Furthermore, the lower drain-source voltages are less likely to damage the third and fourth cascode transistors 212 and 214.

When the second input control signal In2CTL has a first value, the seventh and eighth switches 286 and 288 are open. When the second input control signal In2CTL has a second value, the seventh and eighth switches 286 and 288 are closed.

When the seventh and eighth switches 286 and 288 are closed, the seventh and eighth switches 286 and 288 and the seventh and eighth capacitors 276 and 278 operate to provide shunts across the sources and drains of the third and fourth input transistors 216 and 218, respectively. The shunts cause the drain-source voltages of the third and fourth input transistors 216 and 218 to be lower than when the seventh and eighth switches 286 and 288 are open.

The second input control signal In2CTL may be controlled as described for the first cascode control signal Cas1CLT.

The second resonant tank circuit T2 includes a second tank inductor 2-244 and a second tank variable capacitor 2-248. The second tank inductor 2-244 is connected between the drain of the third input transistor 216 of the plus side circuit of the second differential cascode amplifier DCAS2 and the drain of the fourth input transistor 218 of the minus side circuit of the second differential cascode amplifier DCAS2.

The second tank variable capacitor 2-248 is connected between the drain of the third input transistor 216 and the drain of the fourth input transistor 218, in parallel with the second tank inductor 2-244. A capacitance value of the second tank variable capacitor 2-248 is controlled according to a second tank control signal T2CTL. In an embodiment, the second tank control signal T2CTL is a signal in the PA control signal PACTL of FIG. 1.

The second resonant tank circuit T2 configured to compensate for parasitic capacitances of the third and fourth input transistors 216 and 218 by resonating with the parasitic capacitances at a resonance frequency. The resonance frequency is determined by an inductance value of the second tank inductor 2-244, capacitance values of the parasitic capacitances, and a capacitance value of the second tank variable capacitor 2-248.

In the embodiment of FIG. 1, the controller circuit 108 controls the resonance frequency of the second resonant tank circuit T2 using the second tank control signal T2CTL. The controller circuit 108 may control the resonance frequency according to a transmission mode of the electronic device 10, a frequency of the carrier frequency signal CF, or both.

An RF output signal RFout of the PA 2-110 is produced by combining outputs of the plus and minus side circuits of the first and second differential cascode amplifier stages DCAS1 and DCAS2. Specifically, the RF output signal RFout is produced at a second terminal of a second winding of the first output transformer 292. A first terminal of the second winding of the first output transformer 292 is connected to a first terminal of a second winding of the second output transformer 294.

A second terminal of the second winding of the second output transformer 294 is connected to a second terminal of a second winding of the fourth output transformer 298. A first terminal of the second winding of the fourth output transformer 298 is connected to a first terminal of a second winding of the third output transformer 296. A second terminal of the second winding of the third output transformer 296 is connected to the ground.

A voltage value of the RF output signal RFout is equal to a sum of output values of the plus side circuits of the first and second differential cascode amplifier stages DCAS1 and DCAS2 minus a sum of output values of the minus side circuits of the first and second differential cascode amplifier stages DCAS1 and DCAS2.

A ninth capacitor 250 has a first terminal connected to the first terminal of the first winding of the first output transformer 292 and a second terminal connected to the first terminal of the first winding of the third output transformer 296. A tenth capacitor 270 has a first terminal connected to the first terminal of the first winding of the second output transformer 294 and a second terminal connected to the first terminal of the first winding of the fourth output transformer 298.

In an embodiment, capacitance values of the ninth and tenth capacitors 250 and 270 are selected so that, in combination with inductance values of the PA 2-110, the ninth and tenth capacitors 250 and 270 form circuits that have a resonance frequency equal to a second harmonic frequency of a frequency of the RF output signal RFout. The inductance values of the PA 2-110 may include inductance values of the traces connecting the ninth and tenth capacitors 250 and 270 to their respective windings, as described above. The ninth and tenth capacitors 250 and 270 act as a short at the second harmonic frequency, and operate to attenuate components of the RF output signal RFout that have frequencies at or near the second harmonic frequency.

A fifteenth capacitor 255 is connected between the source of the first input transistor 206 and the source of the third input transistor 216. A sixteenth capacitor 275 is connected between the source of the second input transistor 208 and the source of the fourth input transistor 218.

In an embodiment of the PA 2-110, the first through eighth capacitors 252 through 278, ninth and tenth capacitors 250 and 270, and eleventh through sixteenth capacitors 251 through 275 are on-chip capacitors provided in a semiconductor chip. In an embodiment, the first through eighth capacitors 252 through 278, ninth and tenth capacitors 250 and 270, and eleventh through sixteenth capacitors 251 through 275 may each have capacitance values between 1 and 10 picofarads.

In an embodiment of the PA 2-110, the first through eighth input transformers 222 through 238 are on-chip transformers provided in a semiconductor chip. In an embodiment, the first through fourth output transformers 292 through 298 are on-chip transformers provided in a semiconductor chip.

Figure 3:
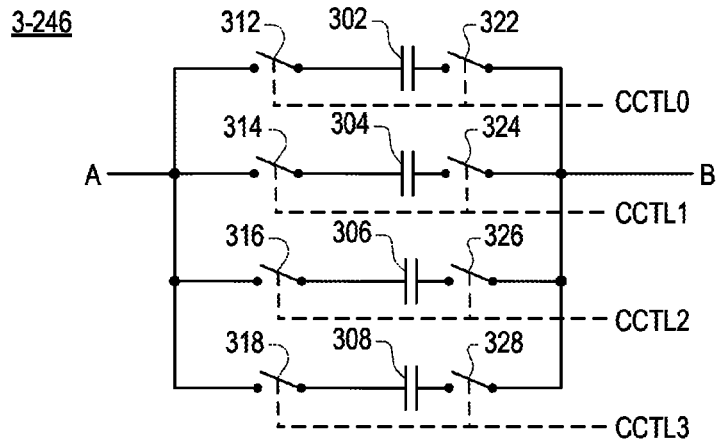
FIG. 3 is a schematic of variable capacitor suitable for use in the power amplifier of FIG. 2 according to an embodiment.

FIG. 3 is a schematic of variable capacitor 3-246 suitable for use as either of the first or second tank variable capacitors 2-246 or 2-248, or both, in the PA 2-110 of FIG. 2 according to an embodiment.

The variable capacitor 3-246 includes first through fourth capacitors 302 through 308, first through fourth left-side switches 312 through 318, and first through fourth right-side switches 322 through 328.

First terminals of the first through fourth capacitors 302 through 308 are connected to a terminal A of the variable capacitor 3-246 using the first through fourth left-side switches 312 through 318, respectively. Second terminals of the first through fourth capacitors 302 through 308 are connected to a terminal B of the variable capacitor 3-246 using the first through fourth right-side switches 322 through 328, respectively.

The first through fourth left-side switches 312 through 318 and the first through fourth right-side switches 322 through 328 are controlled by first through fourth capacitance control signals CCTL0 through CCTL3. In an embodiment of the variable capacitor 3-246, the first through fourth capacitance control signals CCTL0 through CCTL3 are signals of the first tank control signal T1CTL of FIG. 3. In another embodiment of the variable capacitor 3-246, the first through fourth capacitance control signals CCTL0 through CCTL3 are signals of the second tank control signal T2CTL of FIG. 3.

A capacitance value of the variable capacitor 3-246 is equal to a sum of capacitance values of the first through fourth capacitors 302 through 308 having the respective left-side and right-side switches turned on by the first through fourth capacitance control signals CCTL-0 through CCTL3.

In an embodiment, the capacitance values of the first through fourth capacitors 302 through 308 are substantially identical. In an embodiment, the variable capacitor 3-246 may have a lesser or greater number of capacitors than shown in FIG. 3.

Figure 4:
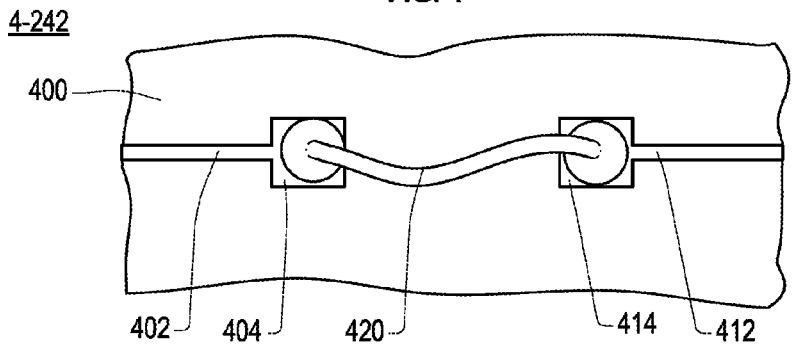
FIG. 4 is a plan view of an inductor suitable for use in the power amplifier of FIG. 2 according to an embodiment.

FIG. 4 is a plan view of an inductor 4-242 suitable for use in the PA 2-110 of FIG. 2 according to an embodiment. In an embodiment, the inductor 4-242 is used as the first tank inductor 2-242 of the PA 2-110.

The inductor 4-242 includes first and second conductive traces 402 and 412 disposed on an insulating layer of a substrate 400. In an embodiment, the substrate 400 is a semiconductor chip. The first and second conductive traces 402 and 412 connect to first and second bond pads 404 and 414, respectively. The first and second bond pads 404 and 414 are also disposed on the substrate 400.

A bond wire 420 is connected between the first and second bond pads 404 and 414. The bond wire 420 is disposed above a surface of the substrate 400. In an embodiment, an inductance value of the inductor 4-242 is substantially equal to an inductance value of the bond wire 420.

Figure 5:
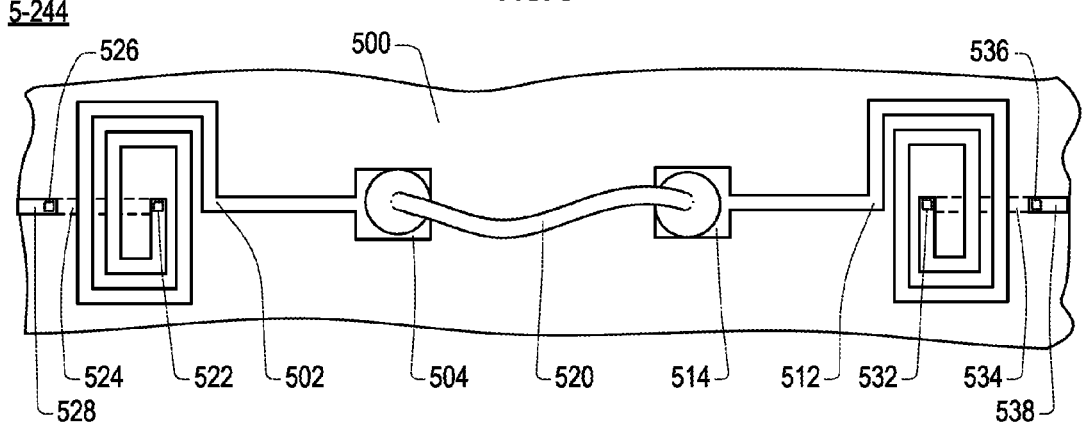
FIG. 5 is a plan view of an inductor suitable for use in the power amplifier of FIG. 2 according to an embodiment.

FIG. 5 is a plan view of an inductor 5-244 suitable for use in the PA 2-110 of FIG. 2 according to an embodiment. In an embodiment, the inductor 5-244 is used as the second tank inductor 2-244 of the PA 2-110.

The inductor 5-244 includes first and second conductive traces 502 and 512 disposed on an insulating layer of a substrate 400. In an embodiment, the substrate 400 is a semiconductor chip. The first and second conductive traces 502 and 512 are each formed into coil inductors. First and second conductive vias 522 and 526 and a first lower-level conductive trace 524 connect a first end of the first conductive trace 502 to a third conductive trace 528. Third and fourth conductive vias 532 and 536 and a second lower-level conductive trace 534 connect a first end of the second conductive trace 512 to a fourth conductive trace 538.

Second ends of the first and second conductive traces 502 and 512 are connected to first and second bond pads 504 and 514, respectively. The first and second bond pads 504 and 514 are disposed on the substrate 500.

A bond wire 520 is connected between the first and second bond pads 504 and 514. The bond wire 520 is disposed above a surface of the substrate 500. In an embodiment, an inductance value of the inductor 5-244 is substantially equal to a sum of an inductance value of the bond wire 520, an inductance value of the first conductive trace 502, and an inductance value of the second conductive trace 512.

In an embodiment, the bond wire 520 and first and second bond pads 504 and 514 may be omitted and the first conductive trace 502 may be connected to the second conductive trace 512. In another embodiment, the second conductive trace 512, third and fourth conductive vias 532 and 536, and second lower-level conductive trace 534 may also be omitted, and the first conductive trace 502 may be connected to the fourth conductive trace 538.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. An apparatus comprising:
   a differential amplifier, the differential amplifier including:
   a first side circuit configured to receive a first input signal, the first side circuit including a first cascode transistor, a first capacitor, and a first switch, the first capacitor and the first switch being provided in series between a source and a drain of the first cascode transistor;
   a second side circuit configured to receive a second input signal; and
   a resonant tank circuit coupled between the first and second side circuits.

2. The apparatus of claim 1,
   wherein the second side circuit includes a second cascode transistor,
   wherein the first and second input signals are a differential signal pair, and
   wherein the resonant tank circuit is coupled between the source of the first cascode transistor and a source of the second cascode transistor.

3. The apparatus of claim 1, further comprising:
   a controller circuit configured to control the first switch according to a transmission mode, a determination regarding a source-drain voltage of the first cascode transistor, or both.

4. The apparatus of claim 2, wherein the first side circuit further includes:
   a first input transistor, the first input transistor including a gate configured to receive the first input signal and a drain connected to the source of the first cascode transistor;
   a second capacitor; and
   a second switch,
   wherein the second capacitor and the second switch are provided in series between a source and the drain of the first input transistor.

5. The apparatus of claim 1, wherein the resonant tank circuit includes:
   an inductor; and
   a variable capacitor provided in parallel with the inductor.

6. The apparatus of claim 5, further comprising a controller circuit configured to control a capacitance value of the variable capacitor according to a transmission mode, a frequency band, or both.

7. The apparatus of claim 5, wherein the inductor and variable capacitor are provided in a semiconductor die.

8. The apparatus of claim 1, wherein the resonant tank circuit is a first resonant tank circuit, and wherein the differential amplifier further includes:
   a third side circuit configured to receive the first input signal;
   a fourth side circuit configured to receive the second input signal; and a second resonant tank circuit coupled between the third and fourth side circuits.

9. The apparatus of claim 8,
wherein the first cascode transistor is a first n-channel Metal-Oxide-Semiconductor Field Effect (nMOSFET) cascode transistor,
wherein the second side circuit includes a second nMOSFET cascode transistor,
wherein the third side circuit includes a first p-channel Metal-Oxide-Semiconductor Field Effect (pMOSFET) cascode transistor,
wherein the fourth side circuit includes a second pMOSFET cascode transistor,
wherein the first resonant tank circuit is coupled between the source of the first nMOSFET cascode transistor and a source of the second nMOSFET cascode transistor, and
wherein the second resonant tank circuit is coupled between a source of the first pMOSFET cascode transistor and a source of the second pMOSFET cascode transistor.

10. The apparatus of claim 9, further comprising:
a second capacitor coupled between the drain of the first nMOSFET cascode transistor and a drain of the first pMOSFET cascode transistor; and
a third capacitor coupled between a drain of the second nMOSFET cascode transistor and a drain of the second pMOSFET cascode transistor.

11. An amplifier comprising:
a transistor including a control terminal to receive an input signal, the transistor being a cascode transistor;
a capacitor; and
a switch,
wherein the switch and the capacitor are provided in series between first and second conduction terminals of the transistor.

12. The amplifier of claim 11, wherein the transistor is a Metal-Oxide-Semiconductor Field Effect Transistor (MOSFET).

13. A method comprising:
receiving a first input signal by a first side circuit, the first side circuit including a cascode transistor, a first capacitor, and a first switch, the first capacitor and the first switch being provided in series between a source and a drain of the cascode transistor;
receiving a second input signal by a second side circuit;
controlling a resource of a resonant tank circuit; and
outputting an output signal according to the first and second input signals.

14. The method of claim 13, wherein the resonant tank circuit is coupled between the first and second side circuits.

15. The method of claim 13, further comprising:
detecting a condition associated with an occurrence of a high source-drain voltage of the transistor; and
turning on the switch when the condition is detected.

16. The method of claim 13, further comprising:
receiving the first input signal by a third side circuit;
receiving the second input signal by a fourth side circuit; and
combining outputs of the first, second, third and fourth side circuits.

17. The method of claim 13, further comprising controlling the resource of the resonant tank circuit according to a transmission mode, a frequency band, or both.

18. The method of claim 13, wherein the first side circuit further includes an input transistor, a second capacitor, and a second switch, the input transistor receiving the first input signal, and wherein the second capacitor and the second switch are provided in series between a source of the input transistor and a drain of the input transistor,
the method further comprising closing the second switch when a situation is detected wherein a high source-drain voltage might occur.

19. The amplifier of claim 11, wherein the capacitor is a first capacitor, and the switch is a first switch, the amplifier further comprising:
an input transistor transistor including a gate configured to receive an input signal and a drain connected to the source of the cascode transistor;
a second capacitor; and
a second switch,
wherein the second capacitor and the second switch are provided in series between a source and the drain of the input transistor.

* * * * *